(12) United States Patent
Lamberts et al.

(10) Patent No.: US 10,897,273 B2
(45) Date of Patent: Jan. 19, 2021

(54) SYSTEM-LEVEL ERROR CORRECTION CODING ALLOCATION BASED ON DEVICE POPULATION DATA INTEGRITY SHARING

(71) Applicant: Western Digital Technologies, Inc., San Jose, CA (US)

(72) Inventors: Bernd Lamberts, San Jose, CA (US); Remmelt Pit, Menlo Park, CA (US); Timothy Lieber, Colorado Springs, CO (US); Robert M. Lester, Colorado Springs, CO (US); Zarko Popov, Mission Viejo, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 196 days.

(21) Appl. No.: 16/020,853

(22) Filed: Jun. 27, 2018

(65) Prior Publication Data
US 2020/0007169 A1    Jan. 2, 2020

(51) Int. Cl.
*H03M 13/00*    (2006.01)
*H03M 13/35*    (2006.01)
(Continued)

(52) U.S. Cl.
CPC .......... *H03M 13/356* (2013.01); *G06F 3/068* (2013.01); *G06F 3/0619* (2013.01); *G06F 3/0659* (2013.01); *G06F 11/1076* (2013.01)

(58) Field of Classification Search
CPC .. H03M 13/356; G06F 3/0619; G06F 3/0659; G06F 3/068; G06F 11/1076
See application file for complete search history.

(56) References Cited

U.S. PATENT DOCUMENTS 6,961,890 B2    11/2005    Smith
7,730,344 B1 *    6/2010    Perozo ............ G11B 20/10527
                                                                714/6.13
(Continued)

FOREIGN PATENT DOCUMENTS

EP          3128427 A1    2/2017
WO    WO2005057412 A1    6/2005
(Continued)

OTHER PUBLICATIONS

Puttarak, Nattakan, Coding for storage: disk arrays, flash memory, and distributed storage networks, Lehigh Preserve, 2011, 180 pages, Theses and Dissertations, Paper 1144, Lehigh University, USA.
(Continued)

*Primary Examiner* — Christine T. Tu
(74) *Attorney, Agent, or Firm* — John D. Henkhaus (57) ABSTRACT

A dynamic scalable error correction coding (ECC) scheme for a data storage system involves a system controller predicting a type and/or amount of ECC needed to reconstruct data to be stored on a particular data storage device(s) based on operational data integrity information accessed from the array of data storage devices. Thus, redundancy does not need to be allocated unless required. The devices may be logically grouped into subsets according to common characteristics, whereby the prediction made for a device in a subset may be based on the data integrity information from that subset, as well as from other relevant subsets.

26 Claims, 5 Drawing Sheets

(51) Int. Cl.
    *G06F 11/10*     (2006.01)
    *G06F 3/06*     (2006.01)

(56) References Cited

U.S. PATENT DOCUMENTS

| | | | |
|---|---|---|---|
| 8,856,439 | B2 | 10/2014 | Weber et al. |
| 8,898,548 | B1 | 11/2014 | Mullendore et al. |
| 9,112,537 | B2 | 8/2015 | Ramirez et al. |
| 9,690,656 | B2 | 6/2017 | Strauss et al. |
| 9,786,386 | B2 | 10/2017 | Strauss et al. |
| 9,916,199 | B2 | 3/2018 | Azogui et al. |
| 9,952,939 | B1 | 4/2018 | Sun et al. |
| 2008/0195900 | A1 | 8/2008 | Chang et al. |
| 2010/0211851 | A1 | 8/2010 | Dixon |
| 2010/0251036 | A1* | 9/2010 | Moyer ............... G06F 11/1064 714/53 |
| 2010/0251068 | A1* | 9/2010 | Lin ..................... G06F 11/1068 714/755 |
| 2011/0047437 | A1 | 2/2011 | Flynn |
| 2011/0116491 | A1 | 5/2011 | Kovacs et al. |
| 2011/0191654 | A1 | 8/2011 | Rub |
| 2012/0124448 | A1 | 5/2012 | Emerson et al. |
| 2013/0145238 | A1 | 6/2013 | Alhussien et al. |
| 2013/0159813 | A1 | 6/2013 | Radke |
| 2014/0006898 | A1 | 1/2014 | Sharon et al. |
| 2014/0019823 | A1 | 1/2014 | Ramirez et al. |
| 2014/0143523 | A1* | 5/2014 | Chadha ................. G06F 9/3824 712/220 |
| 2015/0074487 | A1 | 3/2015 | Patapoutian et al. |
| 2015/0100854 | A1 | 4/2015 | Lu |
| 2016/0110252 | A1 | 4/2016 | Hyun et al. |
| 2016/0132388 | A1 | 5/2016 | Kim |
| 2017/0039104 | A1 | 2/2017 | Kapoor et al. |
| 2017/0249242 | A1 | 8/2017 | Thatcher et al. |
| 2018/0024877 | A1 | 1/2018 | Gold et al. |
| 2018/0029331 | A1 | 2/2018 | Bortell et al. |
| 2018/0069658 | A1 | 3/2018 | Benisty et al. |

FOREIGN PATENT DOCUMENTS

| | | |
|---|---|---|
| WO | WO2009126641 A9 | 10/2009 |
| WO | WO2016048634 A1 | 3/2016 |

OTHER PUBLICATIONS

Kim, Jangwoo, et al., Multi-bit Error Tolerant Caches Using Two-Dimensional Error Coding, Proceedings of the 40th Annual ACM/IEEE International Symposium on Microarchitecture, Dec. 1-5, 2007, 13 pages.

Cassuto, Yuval, Coding Techniques for Data-Storage Systems, 2008, 180 pages, California Institute of Technology, USA.

Ghosh, Shalini, et al., Low-Density Parity Check Codes for Error Correction in Nanoscale Memory, Sep. 25, 2007, pp. 1-22, SRI International, Menlo Park, CA.

Ghosh, Shalini, et al., Dynamic Low-Density Parity Check Codes for Fault-tolerant Nanoscale Memory, Jan. 2007, 5 pages, Computer Science Laboratory, SRI International, Menlo Park, CA.

Hardesty, Larry, New frontier in error-correcting codes, MIT News Office, Oct. 2, 2014, 3 pages, MIT.

U.S. Appl. No. 15/497,879, filed Apr. 26, 2017 by common Applicant Western Digital Technologies, Inc.

Korean Intellectual Property Office (ISA/KR), PCT International Search Report and Written Opinion for counterpart International application No. PCT/US2019/020607, dated Jun. 20, 2019, 12 pages.

Diaz C. et al., A video-aware FEC-based unequal loss protection system for video streaming over RTP, IEEE Transactions in Consumer Electronics, May 2011, pp. 523-531, vol. 57, No. 2, IEEE.

Li J. et al., Realizing Unequal Error Correction for NAND Flash Memory at Minimal Read Latency Overhead, IEEE Transactions on Circuits and Systems II: Express Briefs, May 2014, pp. 354-358, vol. 61, No. 5, IEEE.

* cited by examiner

SYSTEM-LEVEL ERROR CORRECTION CODING ALLOCATION BASED ON DEVICE POPULATION DATA INTEGRITY SHARING

FIELD OF EMBODIMENTS

Embodiments of the invention may relate generally to data storage systems and, more particularly, to error correction coding (ECC) based on data integrity information from the system storage devices.

BACKGROUND

There is a commercial demand for high-capacity digital data storage systems, in which multiple data storage devices (DSDs) are housed in a common enclosure. Data storage systems often include large enclosures that house multiple shelves on which rows of DSDs are mounted. Historically, storage systems have strictly autonomous independently designed error redundancy schemes. This leads to overlap and reduced efficiency in the overall system. For example, the device may allocate parity to protect any error from any component for any data, regardless of whether this is required or whether the host might need those data. Thus, this error correction coding on the device may increase the failure footprint (i.e., the smallest error event), the latency invoked, and the cost of the system.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to error correction coding (ECC) based on data integrity information from the system storage devices are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Data Storage System

Figure 2:
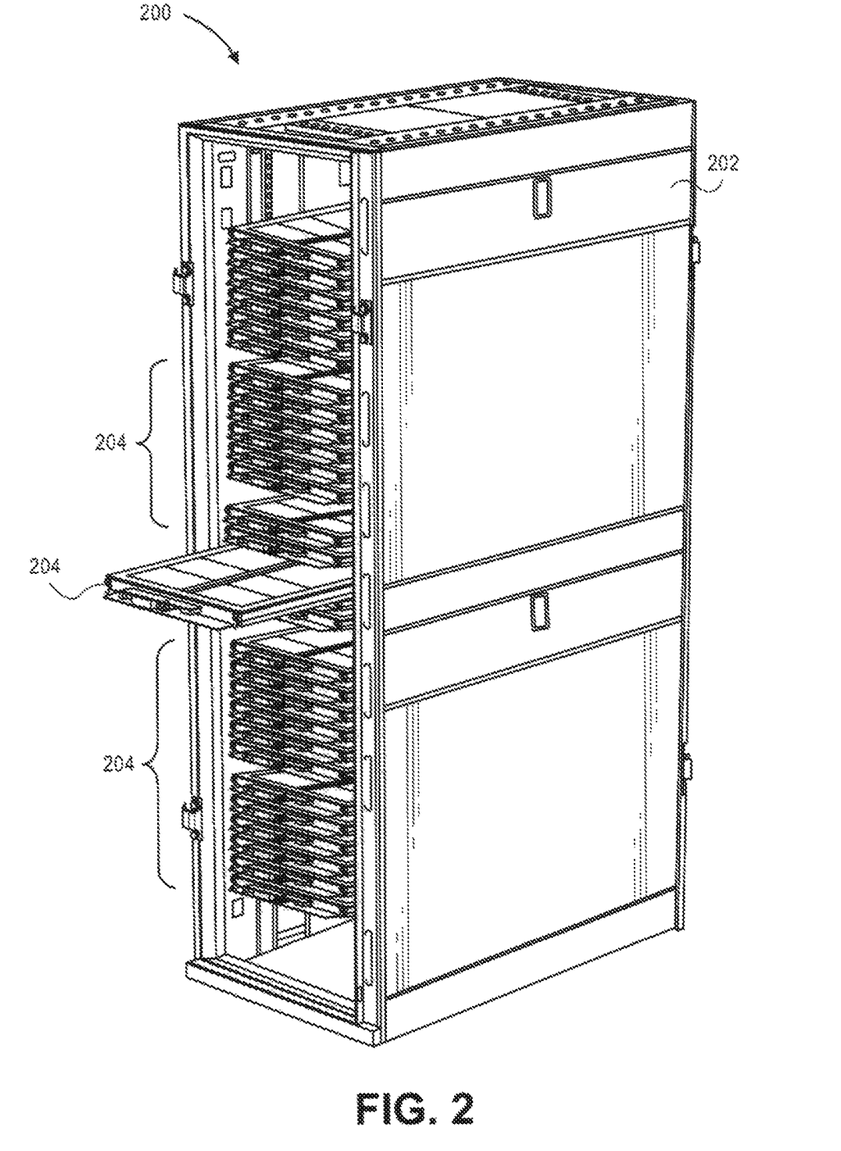
FIG. 2 is a perspective view illustrating a data storage system, according to an embodiment.

There is a commercial demand for high-capacity digital data storage systems, in which multiple data storage devices (DSDs) are housed in a common enclosure. Data storage systems often include large enclosures that house multiple shelves on which rows of DSDs are mounted. FIG. 2 is a perspective view illustrating a data storage system, according to embodiments. A data storage system 200 comprises a system enclosure 202 (or "rack 202"), in which multiple data storage system trays 204 are housed. Each tray 204 may be placed or slid into a corresponding slot within the rack 202. Rack 202 further houses a system controller, and may further house switches, storage server(s), application server(s), a power supply, cooling fans, etc.

Figure 3:
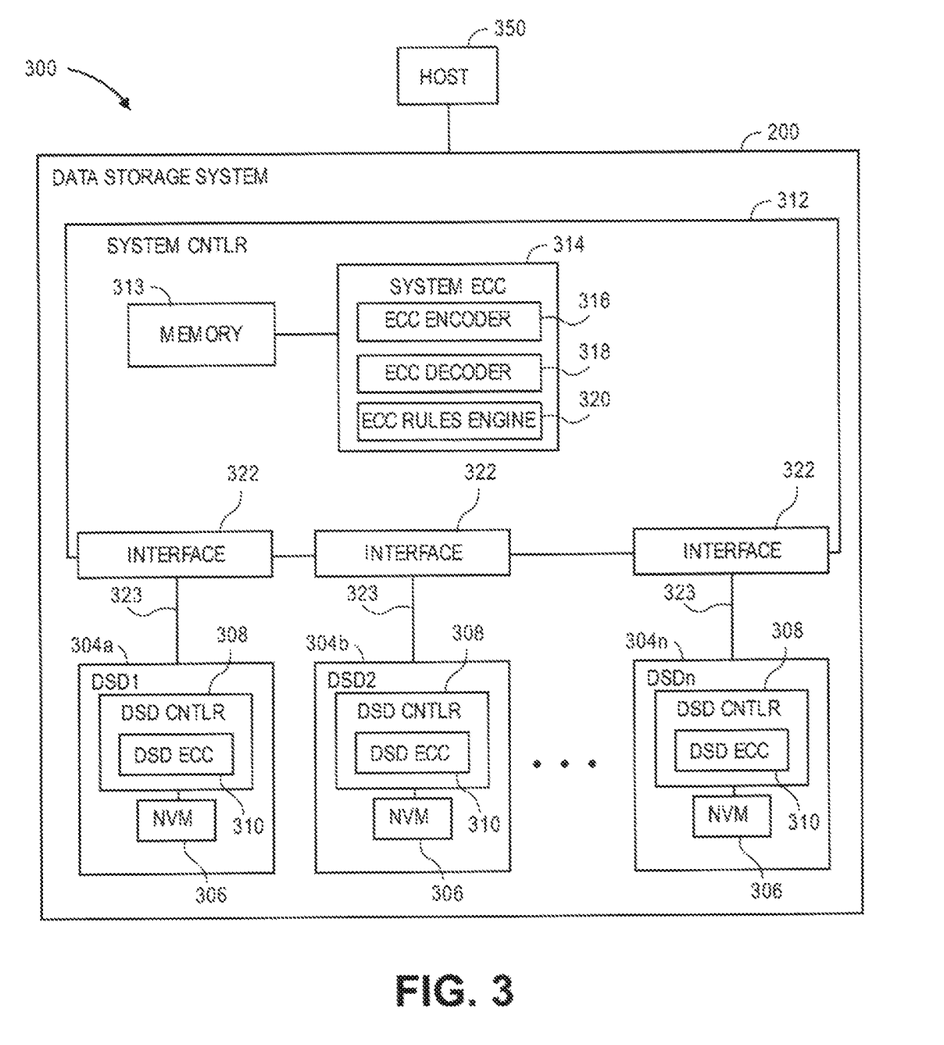
FIG. 3 is a block diagram illustrating a data storage system architecture, according to an embodiment.

FIG. 3 is a block diagram illustrating a data storage system architecture, according to an embodiment. Example architecture 300 illustrates a data storage system 200 that comprises multiple data storage devices (DSDs) 304a (DSD1), 304b (DSD2), and 304n (DSDn), where n represents an arbitrary number of DSDs that may vary from implementation to implementation. Each DSD 304a-304n is under the control of and communicative with a system controller 312, via a communication interface 322 according to a corresponding communication protocol 323. Each DSD 304a, 304b, 304n includes corresponding non-volatile memory (NVM) 306 controlled by a respective DSD controller 308, which includes a DSD ECC module 310. Each DSD ECC module 310 (which may be, for example, constituent to a corresponding system on chip (SoC), such as part of the data channel or the hard disk controller in the context of an HDD) is capable of performing "track ECC" processing, i.e., ECC encoding/decoding at the data track level, using procedures such as those known in the art. System controller 312 includes memory 313, a system ECC module 314, which includes an ECC encoder 316, an ECC decoder 318, and an ECC rules engine 320, each of which represents procedural functionality involving ECC parity encoding and decoding, as described in more detail elsewhere herein.

Processing, functions, procedures, actions, method steps, and the like, that are described herein as being performed or performable by system controller 312, or by a DSD 304a-304n, may include enactment by execution of one or more sequences of instructions stored in one or more memory units and which, when executed by one or more processors, cause such performance. System controller 312 may be embodied in any form of and/or combination of hardware, software, and firmware. For example, and according to an embodiment, the system controller 312 comprises an application-specific integrated circuit (ASIC) comprising at least one memory unit for storing such instructions (such as firmware, for a non-limiting example) and at least one processor for executing such instructions, enabling ECC parity allocation, encoding, decoding, and application to recover corrupt stored data by transforming corrupt or lost data to its original form as write requested.

The data storage system 200 may be communicatively coupled with a host 350, which may be embodied in a hardware machine on which executable code is executable (for non-limiting examples, a computer or hardware server, and the like), or as software instructions executable by one or more processors (for non-limiting examples, a software server such as a database server, application server, media server, and the like). Host 350 generally represents a client of the data storage system 200, and has the capability to make read and write requests to the data storage system 200.

Note that the system controller 312 may also be referred to as a "host" because the term is often generally used in reference to any device that makes I/O calls to a data storage device or an array of devices.

Introduction

Is used herein, the term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Error correction coding (ECC) (or "error correction code", "error-correcting code", etc.) generally refers to schemes, techniques, procedures, encoding/decoding, and the like, for correcting (i.e., reconstructing, or "recovering") corrupt data. Corrupt data may be the result of incorrect transmission of data, or unwanted bit-flips (bit errors) that occur after data is stored in (i.e., written) to non-volatile memory, or unwanted bit erasures that occur after data is stored to non-volatile memory, such as NVM 306 of DSDs 304a, 304b, 304n (FIG. 3). ECC is typically implemented by adding or appending extra encoded data (at times generally referred to as "parity", "parity data", "parity information", "parity bits", and the like) to associated data, so that the data can be recovered even when a number of errors (up to the capability of the parity being used) are introduced into the data.

As an example, a "write verify" function may be utilized in certain data storage contexts to ensure data reliability (so-called "data integrity"), but can negatively affect system performance by decreasing write command throughput. Thus, maintaining data integrity has its own trade-offs and challenges, and one may consider committing resources to enhanced ECC schemes to recover corrupt data over committing resources to data integrity at the storage device. Stated otherwise, one may be willing to accept less data integrity at the storage device, e.g., at the non-volatile memory 306 of the DSD 304a-304n (FIG. 3), in order to increase performance, while relying further on recovery of corrupt data via more independent, intelligent, and scenario-specific ECC schemes.

Intelligent System-Level Error Correction Coding

As discussed, historical storage systems have strictly autonomous independently designed error redundancy schemes, which can lead to overlap and reduced efficiency in the overall system. By contrast, an expanded holistic view of the data integrity at and among different storage devices as distributed throughout the storage system may lead to a more efficient and more reliable overall storage system.

The data storage devices, such as DSDs 304a-304n (FIG. 3) that are constituent to a data storage system 200 (FIGS. 2 and 3) can be considered sensitive sensors of factors that may affect the data integrity associated with each DSD, such as temperature, airflow, vibration, and the like in the context of HDDs, and age, storage cycles, and the like in the context of SSDs. Furthermore, DSDs 304a-304n in the form of HDDs may be sources of information regarding position error signals (PES) and the factors contributing thereto, corresponding to a specific head or region of media. Hence, data integrity information that each DSD may be internally privy to, and combinations thereof, when shared with a system controller such as controller 312 (FIG. 3), can provide an inexpensive but valuable expanded vision of the symptoms of data degradation at the device level, for use as an informed and efficient ECC controlling point at the system level. There may also be additional information about the DSDs available at the system level, e.g., available to the system controller, that can contribute to and/or be combined to contribute to intelligent predictive ECC decision-making at the system level. For example, in the context of HDDs, the system controller may be made privy to information such as the storage device form factor, the number of disks (and/or actuators), the disks' RPM (revolution per minute), and other common variations among HDD models, and possibly as well as the location of each storage device within a particular shelf and within the system rack (e.g., rack 202 of FIG. 2), relative proximity to fans, fan speed, relative proximity to heat sources, and other factors external to each device itself. Note that the DSDs 304a-304n, as well as the controller 312, may be programmed to "learn" over time. Thus, factors that may affect the data integrity associated with each DSD may not be static, i.e., such factors (and ECC decisions based thereon) may be dynamic.

Figure 4:
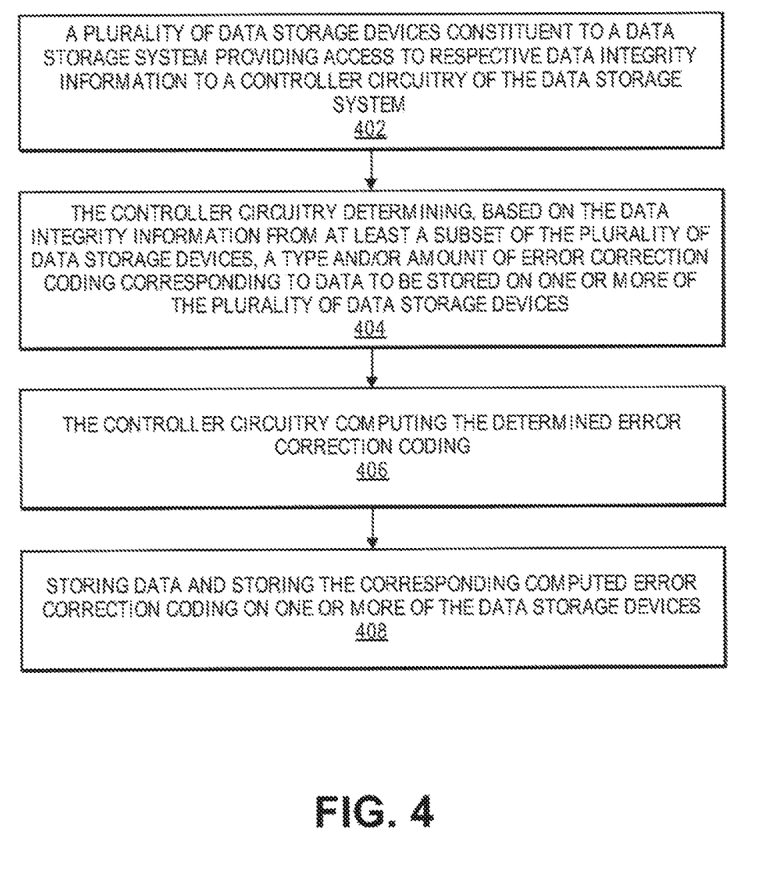
FIG. 4 is a flow diagram illustrating a method for allocating system-level error correction coding (ECC) based on device data integrity information, according to an embodiment.

FIG. 4 is a flow diagram illustrating a method for allocating system-level error correction coding (ECC) based on device data integrity information, according to an embodiment.

At block 402, a plurality of data storage devices constituent to a data storage system provide access to respective data integrity information to system controller circuitry. For example and according to an embodiment, the DSDs 304a-304n (FIG. 3) of data storage system 200 (FIGS. 2, 3) may initiate a messaging protocol (e.g., which may be existing or which may be specifically tailored to this purpose and overlaid onto an existing or other communication protocol) to the system controller 312 (FIG. 3) (or the system controller 312 may operate to initiate the messaging protocol), e.g., via a common communications channel or bus and/or a dedicated communications channel or bus, by which the DSDs 304a-304n (or at least a subset of the DSDs 304a-304n) transmit or report respective data integrity, data fitness, data risk information to the controller 312 via the respective communication interface 322 (FIG. 3). Alternatively, for example and according to an embodiment, the data integrity, data fitness, data risk information may be stored on each corresponding DSD 304a-304n, or on any other of the non-corresponding DSDs 304a-304n, or elsewhere, from which the controller 312 may access/read such data integrity information.

Generally, the data integrity, fitness, risk information characterizes the probability of or risk of a read error (e.g., corrupt data due to bit flips, bit erasures, and the like) occurring when the respective DSD performs a read operation, according to an embodiment. Stated otherwise, each DSD 304a-304n may provide to the controller 312 a set of operational metrics that measure its respective read signal integrity. Furthermore, the system controller 312 may at times choose to change the metrics that it utilizes in ECC decision-making based on, for non-limiting examples, the significance of the corresponding stored data, the cost associated with replacing or rebuilding the stored data from other sources, and the like.

For one non-limiting example, each or any DSD 304a-304n may provide raw signal integrity corresponding to an HDD sector, such as in the form of a local iteration counter, which is a signal quality metric regarding how difficult or processing-intensive it is for the read channel to decode bits. For another non-limiting example, each or any DSD 304*a*-304*n* may provide data integrity, fitness, risk information regarding adjacent track interference (ATI) and/or far track interference (FTI) and/or track squeeze, and the effects thereof (e.g., amplitude change, erase band width, byte error rate), to name a few. Other data integrity metrics sharable by the DSDs 304*a*-304*n* to the controller 312 for this purpose may be, for non-limiting examples, per head or per zone signal to noise ratio (SNR) margin, information about write inhibit feed forward and intelligent write verify operations in the context of shingled magnetic recording (SMR) HDDs, HDD disk load/unload zones, and the like.

Generally, the types of data integrity, fitness, risk information that the DSDs 304*a*-304*n* may provide to the controller 312 are relatively unbounded, within the context of local knowledge that the DSD has about itself, and with the goal of providing information to enable the controller 312 to perform relevant risk assessment and prediction with respect to the quality of a read signal generated within the DSD. This is not to say the information provided by the DSDs 304*a*-304*n* to the controller 312 is arbitrary, rather the overall system design, development, and implementation of the techniques described herein would benefit from an integrated approach to what types of information is available to each DSD and valuable to the system controller for assessment and predictive purposes.

At block 404, the controller circuitry determines, based on the data integrity information from at least a subset of the plurality of data storage devices, a type and/or amount of error correction coding (ECC) corresponding to data to be stored on one or more of the data storage devices. For example, based on the data integrity, fitness, risk information that the population of DSDs 304*a*-304*n* has shared with the controller 312 at block 402 (or at least a subset of such shared information), the ECC rules engine 320 (FIG. 3) of the controller 312 evaluates such information to predict the probability or risk of error corresponding to a read operation of a given DSD 304*a*-304*n*. Then, based on the results of its evaluation (which may be further based on information other than the information collected at block 402), the controller 312 can make an informed decision as to what type and/or amount, level, degree of ECC (for non-limiting examples, low density parity check (LDPC) code at the lowest level, block level code over N logical block addresses (LBAs) at the next level, erasure coding implemented as distributed code over multiple DSDs at the next level, a RAID scheme, and the like) is suitable for handling the associated risk of data corruption, and the controller 312 can then track for which data additional parity is allocated. For example, supposing a baseline parity of 1× bytes of encoded parity for data on a particular DSD, if the data integrity, fitness, risk information shared by that DSD leads to a conclusion or prediction by the controller 312 that the data on that particular DSD is compromised or aging (e.g., by way of thermal decay, squeeze, etc.), then the rules engine 320 of the controller 312 may determine that 2× bytes or even 4× bytes, for example, of encoded parity is suitable for new data written to that particular DSD.

According to an embodiment, the plurality of DSDs 304*a*-304*n* are logically grouped into subsets according to one or more common characteristics (e.g., vibration environment, age, drive type, etc.), and the determining performed at block 404 for a particular subset of DSDs 304*a*-304*n* or for a particular DSD 304*a*-304*n* within the subset is based on the shared data integrity information from that particular subset. Alternatively, according to an embodiment, the determining performed at block 404 for a particular subset of DSDs 304*a*-304*n* or for a particular DSD 304*a*-304*n* within the subset is based on the shared data integrity information from that particular subset and from one or more additional subsets of DSDs 304*a*-304*n*.

The system controller 312 likely has knowledge that is not available to the DSDs 304*a*-304*n*, which it may utilize to make the determination at block 404. For a non-limiting example, controller 312 may have knowledge of the time criticality of certain data, such as based on information in a write request from the host 350 (FIG. 3), based on which the controller 312 determines desired ECC. For example, data for which read latency is more undesirable may in turn be allocated maximum ECC protection. For another non-limiting example, controller 312 has knowledge as to whether redundancy (e.g., ECC parity) for certain data already exists in a different context. For example, the controller 312 may know that erasure coding protection is already available on a larger scale, such as in an archive context, and that read latency is not paramount, based on which the controller 312 foregoes additional ECC protection because the data is already covered by this other form of ECC protection. According to an embodiment, the processing associated with block 404 is performed as a background process, continuously or as processing bandwidth is available. Alternatively, according to an embodiment, the processing associated with block 404 is performed in response to a write request from the host 350, whereby the write request may be queued for writing out to the storage device array while such processing is being performed.

At block 406, the controller 312 computes the ECC determined at block 404, and at block 408, data is stored on (written to) and the corresponding computed ECC is stored on (written to) one or more of the DSDs 304*a*-304*n*. For example and according to an embodiment, the ECC may be stored on the corresponding DSD 304*a*-304*n* on which the corresponding data is stored. Alternatively, for example and according to an embodiment, the data may be stored on one DSD 304*a*-304*n* while the corresponding ECC is stored on a different DSD 304*a*-304*n* from which the data itself is stored (or elsewhere accessible to the controller 312). According to an embodiment, at block 408 the ECC is stored on a virtual track, i.e., a track logically associated with a certain number of HDD sectors of a larger sector grouping. For example, the ECC may be stored on a track separate from the track on which the corresponding data is stored, and for every 100 sectors of a 500-sector group, for a non-limiting example. Thus, an entire track need not be read in order to get to the parity, which is typically stored at the end of the track on which the corresponding data is stored.

Thus, in response to a data read request from a client, such as host 350, the controller 312 makes a read request to the one or more DSDs 304*a*-304*n* on which the data is stored, the one or more DSDs 304*a*-304*n* return to the controller 312 the requested data and the corresponding ECC, and the controller 312 decodes the ECC in order to reconstruct or perfect the requested data. According to an embodiment, the DSDs 304*a*-304*n* return some form of the requested data independent of whether the read operation was successful. That is, in the event of a partial failed read operation, the DSDs 304*a*-304*n* may return "dummy" data for the failed sectors and the controller 312 detects and corrects the data errors based on the available ECC. Furthermore, redundancy or parity that is used often may be cached by the controller 312 (e.g., in memory 313) and/or the DSDs 304*a*-304*n* to improve its availability.

The dynamic and scalable approach to error correction coding (ECC) based on data integrity information from the system storage devices as described herein provides for a more reliable data storage system and, therefore a more available data storage system over its intended or specified or advertised or warranted operational life cycle, than with conventional approaches. This is at least in part because the system controller 312 gains a holistic view of the data signal integrity of the array of data storage devices 304a-304n in view of the informative and practical data integrity feedback that the population of devices 304a-304n reports to or otherwise shares with the controller 312. Hence, a more optimal schema of ECC is employed within the storage system, e.g., only a necessary amount of ECC need be generated in scenarios in which the data integrity is strong and as much ECC as needed can be generated in scenarios in which the data integrity is compromised, and read failures are inhibited. Stated otherwise, the type and amount of ECC more closely maps to the amount of data redundancy actually needed because the type and amount of ECC needed is determined/predicted based on "real" operational knowledge from and about the device array. Thus, this flexible and adaptable approach to ECC further provides for a lower computational cost and more efficient ECC framework in which coding is only generated when and where the need arises. Furthermore, determining at the system level when and where and how much coding is needed provides a better performing data storage system because the ECC computing and processing has a minimal effect on device I/O operations.

Physical Description of an Illustrative Operating Context Hard Disk Drive Configuration Embodiments may be used in the context of a data storage system in which multiple data storage devices (DSDs) such as hard disk drives (HDDs), as well as solid state memory devices (or "solid state drives" (SSDs)) and/or hybrid drives, are employed. Thus, in accordance with an embodiment, a plan view illustrating an HDD 100 is shown in FIG. 1A to illustrate an exemplary operating context.

Figure 1A:
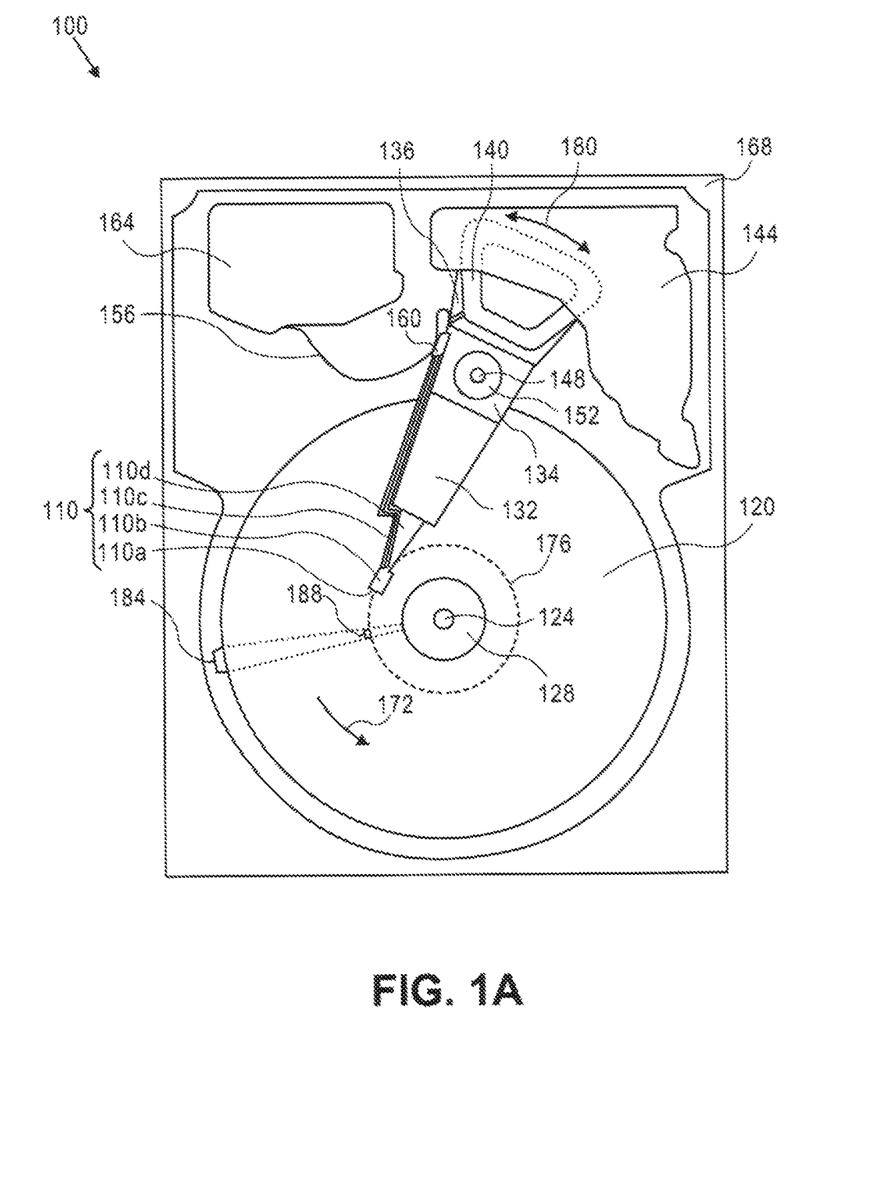
FIG. 1A is a plan view illustrating a hard disk drive (HDD), according to an embodiment.

FIG. 1A illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1A, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

Solid State Drive Configuration

Figure 1B:
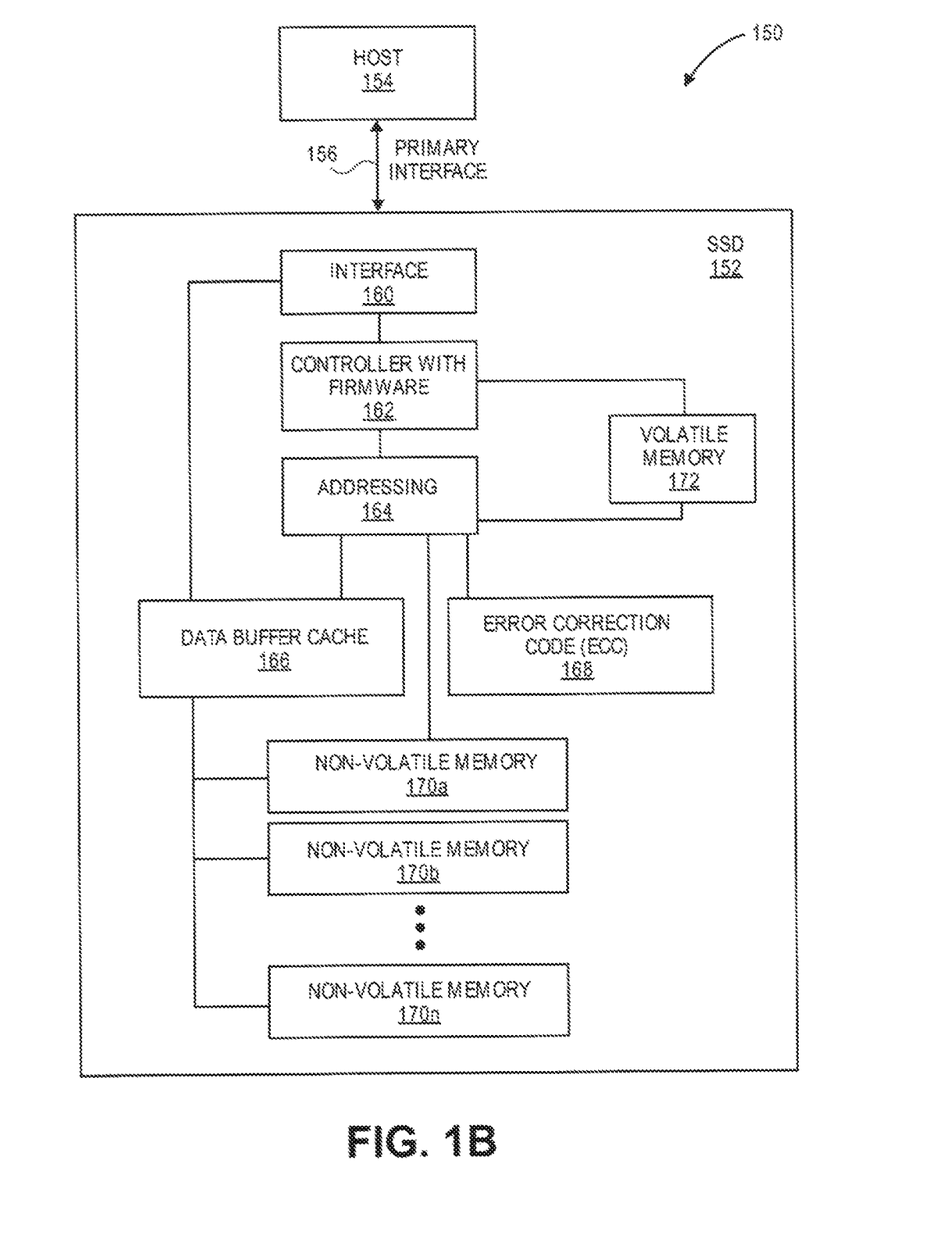
FIG. 1B is a block diagram illustrating a solid-state drive (SSD), according to an embodiment.

FIG. 1B is a block diagram illustrating an example operating context with which embodiments of the invention may be implemented. FIG. 1B illustrates a generic SSD architecture 150, with an SSD 152 communicatively coupled with a host 154 through a primary communication interface 156. Embodiments are not limited to a configuration as depicted in FIG. 1B, rather, embodiments may be implemented with SSD configurations other than that illustrated in FIG. 1B. For example, embodiments may be implemented to operate in other environments that rely on non-volatile memory storage components for writing and reading of data.

Host 154 broadly represents any type of computing hardware, software, or firmware (or any combination of the foregoing) that makes, among others, data I/O requests or calls to one or more memory device. For example, host 154 may be an operating system executing on a computer, a tablet, a mobile phone, or generally any type of computing device that contains or interacts with memory, such as host 350 (FIG. 3). The primary interface 156 coupling host 154 to SSD 152 may be, for example, a storage system's internal bus or a communication cable or a wireless communication link, or the like.

The example SSD 152 illustrated in FIG. 1B includes an interface 160, a controller 162 (e.g., a controller having firmware logic therein), an addressing 164 function block, data buffer cache 166, error correction code (ECC) 168, and one or more non-volatile memory components 170a, 170b-170n.

Interface 160 is a point of interaction between components, namely SSD 152 and host 154 in this context, and is applicable at the level of both hardware and software. This allows a component to communicate with other components via an input/output system and an associated protocol. A hardware interface is typically described by the mechanical, electrical and logical signals at the interface and the protocol for sequencing them. Some non-limiting examples of common and standard interfaces include SCSI (Small Computer System Interface), SAS (Serial Attached SCSI), and SATA (Serial ATA).

An SSD 152 includes a controller 162, which incorporates the electronics that bridge the non-volatile memory components (e.g., NAND flash) to the host, such as non-volatile memory 170a, 170b, 170n to host 154. The controller is typically an embedded processor that executes firmware-level code and is an important factor in SSD performance.

Controller 162 interfaces with non-volatile memory 170a, 170b, 170n via an addressing 164 function block. The addressing 164 function operates, for example, to manage mappings between logical block addresses (LBAs) from the host 154 to a corresponding physical block address on the SSD 152, namely, on the non-volatile memory 170a, 170b, 170n of SSD 152. Because the non-volatile memory page and the host sectors are different sizes, an SSD has to build and maintain a data structure that enables it to translate between the host writing data to or reading data from a sector, and the physical non-volatile memory page on which that data is actually placed. This table structure or "mapping" may be built and maintained for a session in the SSD's volatile memory 172, such as DRAM or some other local volatile memory component accessible to controller 162 and addressing 164. Alternatively, the table structure may be maintained more persistently across sessions in the SSD's non-volatile memory such as non-volatile memory 170a, 170b-170n.

Addressing 164 interacts with data buffer cache 166 and error correction code (ECC) 168, in addition to non-volatile memory 170a, 170b-170n. Data buffer cache 166 of an SSD 152 typically uses DRAM as a cache, similar to the cache in hard disk drives. Data buffer cache 166 serves as a buffer or staging area for the transmission of data to and from the non-volatile memory components, as well as serves as a cache for speeding up future requests for the cached data. Data buffer cache 166 is typically implemented with volatile memory so the data stored therein is not permanently stored in the cache, i.e., the data is not persistent.

ECC 168 is a system of adding redundant data, or parity data, to a message, such that it can be recovered by a receiver even when a number of errors were introduced, either during the process of transmission, or on storage.

Finally, SSD 152 includes one or more non-volatile memory 170a, 170b-170n components. For a non-limiting example, the non-volatile memory components 170a, 170b-170n may be implemented as flash memory (e.g., NAND or NOR flash), or other types of solid-state memory available now or in the future. The non-volatile memory 170a, 170b-170n components are the actual memory electronic components on which data is persistently stored. The non-volatile memory 170a, 170b-170n components of SSD 152 can be considered the analogue to the hard disks in hard-disk drive (HDD) storage devices.

Furthermore, references herein to a data storage device may encompass a multi-medium storage device (or "multi-medium device", which may at times be referred to as a "multi-tier device" or "hybrid drive"). A multi-medium storage device refers generally to a storage device having functionality of both a traditional HDD (see, e.g., HDD 100) combined with an SSD (see, e.g., SSD 150) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A multi-medium storage device may be architected and configured to operate and to utilize the solid-state portion in a number of ways, such as, for non-limiting examples, by using the solid-state memory as cache memory, for storing frequently-accessed data, for storing I/O intensive data, for storing metadata corresponding to payload data (e.g., for assisting with decoding the payload data), and the like. Further, a multi-medium storage device may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A method comprising:
a plurality of data storage devices constituent to a data storage system providing access to respective data integrity information corresponding to respective read signal integrity to a controller circuitry of the data storage system;
the controller circuitry determining, based at least in part on the data integrity information from at least a subset of the plurality of data storage devices, a type and/or amount of error correction coding (ECC) corresponding to prospective data to be stored on one or more of the plurality of data storage devices to inhibit read operation failures;
the controller circuitry computing ECC, according to the determined type and/or amount of ECC, for data from a write request; and
storing the data from the write request and storing the computed ECC for the data from the write request on one or more of the plurality of data storage devices.

2. The method of claim 1, wherein the determining is performed in response to a write request from a client.

3. The method of claim 1, wherein the determining is performed as a background process.

4. The method of claim 1, further comprising:
in response to a data read request from a client, the controller circuitry requesting a read operation from one or more of the data storage devices on which the requested data is stored;
the one or more data storage devices returning to the controller circuitry the requested data and the corresponding ECC; and
the controller circuitry decoding the ECC.

5. The method of claim 1, wherein:
the plurality of data storage devices are logically grouped into subsets according to one or more common characteristics; and
the determining the type and/or amount of ECC for a particular subset of data storage devices is based on the data integrity information from that particular subset.

6. The method of claim 1, wherein:
the plurality of data storage devices are logically grouped into subsets according to one or more common characteristics; and
the determining the type and/or amount of ECC for a particular subset of data storage devices is based on the data integrity information from that particular subset and from one or more additional subsets of data storage devices.

7. The method of claim 1, wherein the data integrity information from a data storage device characterizes signal integrity corresponding to that data storage device.

8. The method of claim 7, wherein the data integrity information from a data storage device comprises a local iteration counter corresponding to at least a portion of a storage medium of that data storage device.

9. The method of claim 7, wherein the data integrity information from a data storage device comprises a metric characterizing adjacent track interference corresponding to at least a portion of a storage medium of that data storage device.

10. The method of claim 1, wherein the determining is further based on time criticality of the data to be stored on the one or more data storage devices.

11. The method of claim 1, wherein the determining is further based on availability of other error correction coding corresponding to the data to be stored on the one or more data storage devices.

12. The method of claim 1, wherein the determining is further based on ensuring operational availability of the data storage system during its specified life cycle.

13. The method of claim 1, wherein:
the storing of the ECC is stored on an ECC track logically associated with a certain number of hard disk drive data sectors of a larger data sector grouping; and
the ECC track is a different track than a track on which corresponding data is stored.

14. The method of claim 1, wherein the providing access to the respective data integrity information includes one or more of the plurality of data storage devices reporting respective data integrity information to the controller circuitry.

15. The method of claim 1, wherein the providing access to the respective data integrity information includes the controller circuitry reading data integrity information stored on one or more of the plurality of data storage devices.

16. The method of claim 1, wherein the storing includes storing the computed ECC on the data storage device on which the corresponding data is stored.

17. The method of claim 1, wherein the storing includes storing the data on a first data storage device and storing the corresponding computed ECC on a different second data storage device.

18. A data storage system comprising:
a plurality of data storage devices; and a system controller circuitry comprising memory and one or more processors and embodying one or more sequences of instructions which, when executed by the one or more processors, cause performance of:
  accessing respective data fitness information corresponding to read signal integrity for data stored on at least a subset of the plurality of data storage devices;
  determining, based at least in part on the accessed data fitness information, a type and/or amount of error correction coding (ECC) corresponding to prospective data to be stored on one or more of the plurality of data storage devices to inhibit read operation failures; and
  in response to a data write command from a client:
    computing ECC, according to the determined type and/or amount of ECC, for data from the write command, and
    commanding writing the data from the write command and writing the computed ECC for the data from the write command onto one or more of the plurality of data storage devices.

19. The data storage system of claim 18, wherein the one or more sequences of instructions, when executed by the one or more processors, cause further performance of:
  in response to a data read request from the client, requesting a read operation from one or more of the data storage devices on which the requested data is stored;
  receiving from the one or more data storage devices the requested data and the corresponding ECC; and
  decoding the ECC.

20. The data storage system of claim 18, wherein:
  the one or more sequences of instructions, when executed by the one or more processors, cause further performance of logically grouping the plurality of data storage devices into subsets based on one or more common characteristics; and
  the determining for a particular subset of data storage devices is based on the data fitness information from at least that particular subset.

21. The data storage system of claim 18, wherein the data fitness information from a data storage device of the plurality of data storage devices characterizes a risk of data read errors corresponding to that data storage device.

22. The data storage system of claim 18, wherein the plurality of data storage devices comprises at least two types of devices from a group consisting of rotating magnetic storage medium devices, solid state memory devices, and multi-medium devices.

23. The data storage system of claim 18, wherein the determining is further based on ensuring operational availability of the data storage system during its warrantied life cycle.

24. A system comprising:
  means for accessing respective data risk information corresponding to data stored on at least a subset of a plurality of data storage devices under the control of an electronic controller; and
  means for predicting, based at least in part on the data risk information from at least a subset of the plurality of data storage devices providing access to the data risk information, whether additional error correction coding (ECC) is desired for prospective data to be stored on one or more of the plurality of data storage devices to inhibit read operation failures.

25. The system of claim 24, further comprising:
  means for computing the additional ECC in response to predicting that additional ECC is desired;
  means for, in response to a data write command from a system client, commanding writing data from the write command and writing the additional ECC for the data from the write command onto one or more of the data storage devices;
  means for requesting, in response to a data read request from the system client, a read operation from one or more of the data storage devices on which requested data is stored;
  means for receiving from the one or more data storage devices the requested data and the corresponding additional ECC; and
  means for decoding the additional ECC to reconstruct the requested data.

26. The system of claim 24, further comprising:
  means for requesting, in response to predicting that additional ECC is not desired and in response to a data read request from a system client, a read operation from one or more of the data storage devices on which the requested data is stored;
  means for receiving from the one or more data storage devices the requested data and ECC already in place for protecting the data; and
  means for decoding the ECC already in place to reconstruct the requested data.

* * * * *